United States Patent
Laitinen et al.

(10) Patent No.: US 8,575,974 B2
(45) Date of Patent: Nov. 5, 2013

(54) METHOD AND CONTROL CIRCUIT FOR CONTROLLING A POWER SEMICONDUCTOR COMPONENT

(75) Inventors: Matti Laitinen, Kirkkonummi (FI); Jukka Palomäki, Espoo (FI)

(73) Assignee: ABB Oy, Helsinki (FI)

( * ) Notice: Subject to any disclaimer, the term of this patent is extended or adjusted under 35 U.S.C. 154(b) by 0 days.

(21) Appl. No.: 13/409,753

(22) Filed: Mar. 1, 2012

(65) Prior Publication Data
US 2012/0223744 A1      Sep. 6, 2012

(30) Foreign Application Priority Data

Mar. 1, 2011   (EP) ................................. 11156403

(51) Int. Cl.
*H03K 3/00* (2006.01)

(52) U.S. Cl.
USPC .......................... 327/108; 327/112; 361/93.1

(58) Field of Classification Search
USPC .................. 327/108, 112; 361/93.1
See application file for complete search history.

(56) References Cited

U.S. PATENT DOCUMENTS

| | | |
|---|---|---|
| 6,687,106 B1 | 2/2004 | Tanaka et al. |
| 6,822,401 B2 * | 11/2004 | Borella et al. ................. 315/291 |
| 7,274,225 B2 * | 9/2007 | Feldtkeller .................... 327/112 |
| 2004/0252432 A1 | 12/2004 | Sasaki et al. |
| 2006/0181831 A1 | 8/2006 | Kojima |
| 2008/0074819 A1 | 3/2008 | Sasaki et al. |
| 2009/0067109 A1 | 3/2009 | Huang et al. |
| 2010/0194451 A1 | 8/2010 | Nuutinen |

FOREIGN PATENT DOCUMENTS

| | | | |
|---|---|---|---|
| DE | 10 2008 062 633 A1 | 9/2009 |
| EP | 1 184 984 A1 | 3/2002 |
| EP | 2 216 905 A1 | 8/2010 |

OTHER PUBLICATIONS

European Search Report dated Aug. 11, 2011.

* cited by examiner

*Primary Examiner* — Kenneth B. Wells
(74) *Attorney, Agent, or Firm* — Buchanan Ingersoll & Rooney PC

(57) ABSTRACT

An exemplary method and a control circuit are disclosed for controlling a power semiconductor component by producing a control signal (Ucin) for controlling the component, forming a second control signal (Ucout) in the potential of the controlled component from the control signal (Ucin), measuring a current flowing through the component, and comparing the measured current with a set limit. A fault signal (Ufault) having a logical state is provided on the basis of the comparison between the measured current and the set limit, producing a component control signal (Uave) from the fault signal (Ufault) and the second control signal (Ucout). If a fault is indicated, the component control signal has a value between high and low states, and otherwise the state of the component control signal (Uave) equals the state of the second control signal (Ucout).

15 Claims, 1 Drawing Sheet

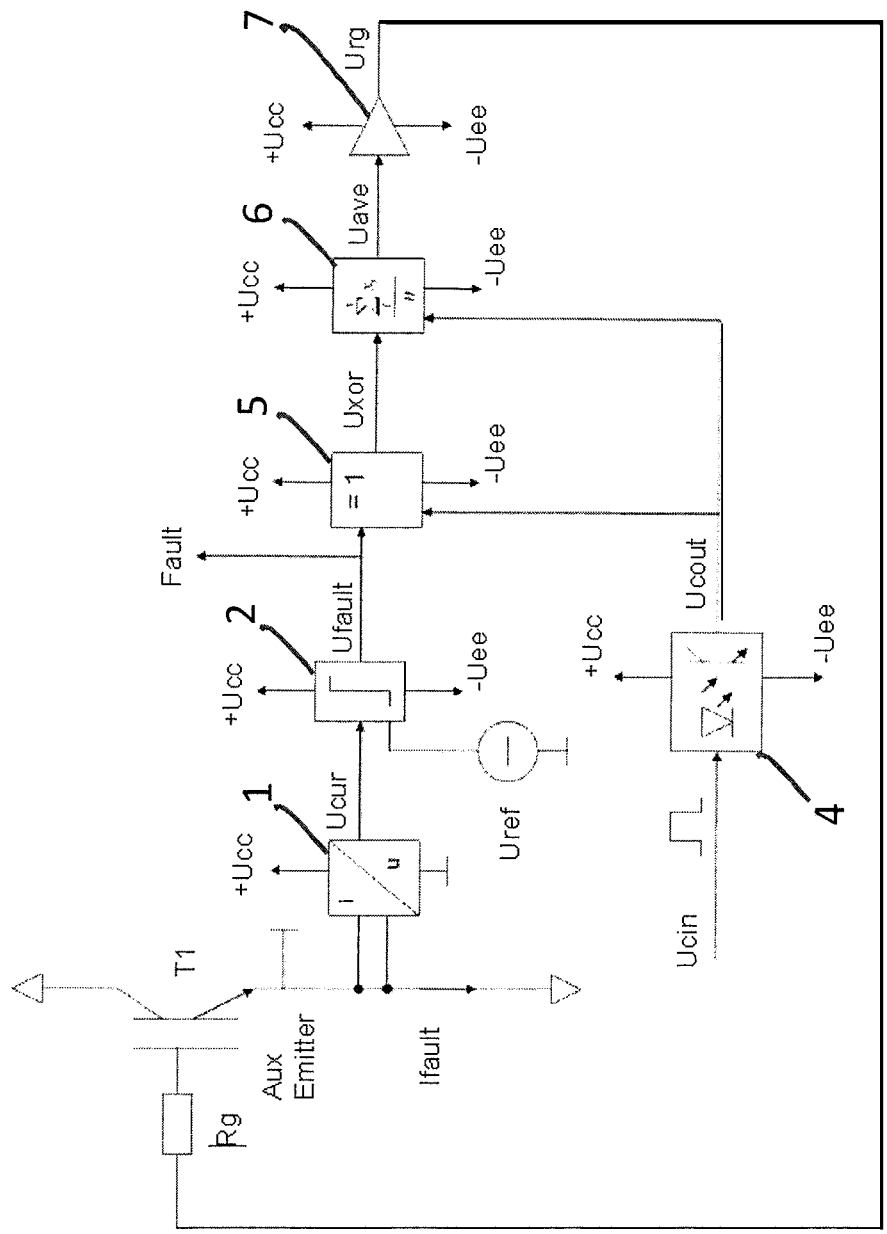

METHOD AND CONTROL CIRCUIT FOR CONTROLLING A POWER SEMICONDUCTOR COMPONENT

RELATED APPLICATION

This application claims priority under 35 U.S.C. §119 to European Patent Application No. 11156403.5 filed in Europe on Mar. 1, 2011, the entire content of which is hereby incorporated by reference in its entirety.

FIELD

The present disclosure relates to control of semiconductor components, and for example, to soft turn-off of IGBT components.

BACKGROUND INFORMATION

An IGBT (Insulated Gate Bi-polar Transistor) is a switch component widely used in power electronic applications due to its good properties. The component can be used at high voltage levels and it can safely turn high currents on and off.

One of the properties of an IGBT component is its ability to shut down the current also in a short circuit situation. In a short circuit, all of the source voltage remains across the switch component. In an exemplary use, one or more IGBT components are used to switch voltages to a load which may be, for example, an electrical motor.

A short circuit current in the IGBT component can be the result of a short circuit in the load. In such a case, the switched high voltage does not meet any impedance and current rises rapidly through the component. In the case of a voltage source inverter, the short circuit current may begin due to shoot-through current.

The IGBT component limits the short circuit current to a component specific value which depends on the gate voltage applied to the gate of the component. This operation point is referred to as an active region or a desaturation region. When an IGBT component is in its active region, the current of the component follows the voltage applied to its gate. The current can be shut down by bringing the gate voltage to and below the threshold voltage of the component.

The shutting down of the short-circuit current can involve a very high current change rate (di/dt). The high rate of change can cause a high voltage spike in the stray inductances of the short circuit current path. This voltage spike makes the voltage across the IGBT component higher than the tolerable voltage and, therefore, the component can be destroyed.

For the above reason, a procedure known as soft turn-off is applied when short circuit current is to be shut down. In soft turn-off, the stored charges from the component are discharged more slowly than in a normal turn-off. This can be carried out by using a gate resistor that has a higher resistance than in normal shut-down operation or by using shut-down voltage that is lower than normal shut-down voltage (i.e. the potential difference is not as high as in usual operation). Also, when the component is controlled with current, a smaller shut-down current is used.

A drawback of the additional gate resistor is the separate parallel branch used in the gate driver circuitry, which can make the structure of the driver more complex. When a different control voltage is used for shut-down operation, a separate voltage level should be structured between turn-on and turn-off voltage levels.

A common drawback of the above solutions is the additional control signal that is led through the floating potential boundary. Control signals for IGBT components can be produced at the potential of a control circuitry which is different from the emitter potential of the IGBT, which is the potential of the gate control. The potentials can be separated by using optoisolators, and the signal for the soft shut-down doubles the number of these components.

SUMMARY

A method of controlling a power semiconductor component is disclosed, comprising: producing a control signal (Ucin) for controlling a component; forming a second control signal (Ucout) in a potential of the controlled component from the control signal (Ucin); measuring a current flowing through the component; comparing the measured current with a set limit; providing a fault signal (Ufault) having a logical state based on the comparing of the measured current and the set limit; producing a component control signal (Uave) from the fault signal (Ufault) and the second control signal (Ucout) such that whenever a fault is indicated, the component control signal has a value between high and low states, and otherwise a state of the component control signal (Uave) equals a state of the second control signal (Ucout); and controlling the component with the component control signal (Uave).

A control circuit is also disclosed for controlling a power semiconductor component, comprising: means for producing a control signal (Ucin) for controlling the component; means for forming a second control signal (Ucout) in a potential of controlled component from the control signal (Ucin); means for measuring a current flowing through the component; means for comparing the measured current with a set limit; means for providing a fault signal (Ufault) having a logical state based on comparing the measured current and the set limit; means for producing a component control signal (Uave) from the fault signal (Ufault) and the second control signal (Ucout) such that whenever a fault is indicated, the component control signal has a value between high and low states and otherwise a state of the component control signal (Uave) equals a state of the second control signal (Ucout); and means for controlling the component with the component control signal (Uave).

BRIEF DESCRIPTION OF THE DRAWINGS

In the following, the invention will be described in greater detail by reference to preferred embodiments and with reference to the accompanying drawings, in which FIG. 1 shows a simplified circuit structure of an embodiment of the invention.

DETAILED DESCRIPTION

According to exemplary embodiments, a measuring of the current of a controlled component and a carrying out of logical operations in the emitter potential of the component are performed. An exemplary circuit and method as disclosed can modify the control signal given by the controller if there is a desire for soft shut-down operation.

A selective shut-down can be accomplished without additional separation components.

An exemplary circuit and the method can produce automatically a soft turn-off always when the current of the component is dangerously high (e.g., when a soft turn-off is needed). In the known structures, the IGBT may switch high currents sometimes a multiple of times before the upper control system has interpreted the fault to be a short circuit or overcurrent. The circuit as disclosed herein can also be realized using analog and digital electronics without programmed circuits or processors.

FIG. 1 shows a simplified circuit diagram of an exemplary embodiment disclosed herein. FIG. 1 shows a controlled IGBT component T1 and a gate resistor Rg connected to a gate of a component.

The circuit comprises a sensor 1 for measuring the current of the collector or emitter current of the switch T1. The sensor for measuring the current is, for example, a measurement resistor connected to a conversion device converting the measured current to a voltage level. The measurement resistor enables the measurement of the current in a differential manner and is placed in the current path of the switch T1 such that the current is detected as a voltage drop across the resistor. The sensor 1 converts the measured current Ifault to a voltage level Ucur. The sensor 1 receives the potential of the auxiliary emitter Aux emitter of the controlled IGBT component and receives voltage +Ucc as the operation voltage. Voltage +Ucc is the positive auxiliary voltage of the gate driver circuitry which is also used as the turn-on voltage of the switch component. The value of +Ucc may be for example +15V (or lesser or greater).

In an exemplary embodiment, the current of the component is measured using a Rogowski coil. The secondary voltage of the Rogowski coil is, for example, integrated for obtaining a voltage Ucur representing the measured current.

The obtained voltage level Ucur, which is proportional to the measured current, is fed to comparator 2. In the comparator, the voltage level Ucur is compared with a reference voltage Uref 3. The reference voltage Uref is set to a level which corresponds to a detection level of the fault current. Thus, when the voltage value Ucur produced by the collector current Ifault exceeds the reference voltage, the measured current is considered to be overcurrent.

The operation of the comparator 2 is such that when the obtained voltage level Ucur exceeds the reference voltage Uref, the output of the comparator is set to high. Otherwise the output is in the low state. At this point the analogue measurement signal is digitized. As seen in FIG. 1, the result of the comparator Ufault is fed further to block 5. The fault signal Ufault can also be given to an upper control system as an indication of a fault situation. This information for the upper control system is not necessary for desired operation. As can be further seen in FIG. 1, the comparator 2 receives voltages +Ucc and −Uee. Voltage −Uee is the negative auxiliary voltage of the gate driver. Its value can be, for example, −15V and it is used as the turn-off voltage.

Block 4 of FIG. 1 represents an isolating component which is used to transmit control signals from control potential to the floating potential of the emitter of the component. Block 4 receives control signal Ucin, according to which the component is controlled. The inputted signal is outputted as second control signal Ucout at the potential of the emitter.

Block 5, to which signals Ufault and Ucout are inputted, is a logic component which ensures that as long as the fault exists, the component is controlled using a soft turn-off signal regardless of the changes in the control of the component. On the other hand, block 5 forwards the state of the second control signal Ucout when no fault is detected. Thus, block 5 is an exclusive OR –logical function producing output signal Uxor.

The signal Uxor is fed to block 6 which calculates the average value Uave of its inputs. The other input to average calculation block 6 is the second control signal Ucout from block 4. The average value is in connection with symmetrical auxiliary voltages +Ucc and −Uee and is 0V. The component control signal Uave obtained from average calculation block 6 is used as the actual control voltage. Signal Uave is fed to a linear amplifier circuit 7 which produces the gate voltage Urg to the gate resistor of the controlled switch T1. The gate voltage Urg is equal to the signal Uave. The linear amplifier circuit 7 is used to produce a required current level for controlling the components.

Although block 6 calculates the average of its input voltages, the value of its output can be set to a desired level. If the calculation is implemented with known operational amplifiers, the output voltage level for the soft turn-off can be set to be any value between the auxiliary voltages. However, also in the case of 0 Volts used for soft turn-off, the current is turned off considerably more slowly than with a normal turn-off voltage.

Table 1 is an exemplary truth-table giving the output from blocks 5 and 6 of FIG. 1 when signals Ufault and Ucout are as inputs.

TABLE 1

| Ufault | Ucout | Uxor | Uave |
|--------|-------|------|------|
| L | L | L | −Uee |
| L | H | H | +Ucc |
| H | L | H | 0 |
| H | H | L | 0 |

In the truth-table of Table 1, the states of signals are presented as high (H) or low (L). It can be seen in the table when the fault signal Ufault is low (e.g., the measured current is below the limit), signal Uxor has the same state as the second control signal Ucout, and Uave, which is the control signal (before amplification), has values −Uee and +Ucc. Thus, the circuitry does not affect the control if the current is below the set limit.

When the measured current is above the set limit, Ufault signal is high. In such a case, the produced component control signal Uave has the value of 0, which is the average of high state and low state (in the case of symmetrical auxiliary voltages). In FIG. 1, signals Ufault, Uxor and Ucout have logical states high and low. These states are represented by voltages +Ucc and −Uee.

In an exemplary embodiment, the logical signals have values of +5V (High) and 0V (Low) and the low voltage state is the potential of the auxiliary emitter of the controlled component. This further means that in the implementation of the circuit, the operation voltage of the circuit is 5 Volts. Since the operations are carried out as logic steps, the selected voltage levels do not alter desired operation. It should be noted, however, that in the calculation of the component control signal Uave, the selected voltage levels should be taken into account. If, for example, a soft turn-off is desired due to a fault situation, the voltage applied to the gate of the controlled component should not be a direct average of the voltages representing the logical states, but scaled to be the average of voltages controlling the IGBT. Thus, if the positive voltage of the gate driver is +15V and the negative voltage of the gate driver is −15V, the average voltage of the circuitry (i.e. 2.5V) should be scaled to be 0 V.

In an exemplary embodiment, the circuit also comprises a holding circuit which is used to lock the fault signal Ufault. The locked fault signal prevents the use of the switch component until the fault signal is released by some other signal. The releasing signal may be given by the user of the apparatus in which the circuit is incorporated. Alternatively, the releasing signal may be given when some criteria relating to the circuit are met.

An exemplary circuit as disclosed herein can comprise multiple means for carrying out the method. The means can be implemented using, for example, digital and analog circuit structures. The circuit structures used can be, for example, operational amplifiers with passive components construed in known fashion to provide the functional features as defined herein.

In the above description, the method and circuit are described in connection with an IGBT. The method and circuit are, however, operational in connection with any switch component based on majority charge carriers, such as MOSFETs and JFETs.

It will be apparent to a person skilled in the art that as technology advances, the inventive concept can be implemented in various ways. The invention and its embodiments are not limited to the examples described above but may vary within the scope of the claims.

It will thus be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A method of controlling a power semiconductor component, comprising:
   producing a control signal (Ucin) for controlling the component;
   forming a second control signal (Ucout) at the potential of the controlled component from the control signal (Ucin), wherein the second control signal has logic high and logic low levels which are equal to first and second supply voltages, respectively;
   measuring a current flowing through the component;
   comparing the measured current with a set limit;
   providing a fault signal (Ufault) having a logical state based on the comparing of the measured current and the set limit;
   producing a component control signal (Uave) from the fault signal (Ufault) and the second control signal (Ucout) such that whenever a fault is indicated, the component control signal has an amplitude between the high and low power supply voltages, and otherwise the amplitude of the component control signal (Uave) is equal to the second control signal (Ucout); and
   controlling the component with the component control signal (Uave).

2. A method according to claim 1, wherein the producing of the component control signal (Uave) comprises:
   feeding the second control signal (Ucout) and the fault signal (Ufault) to an exclusive OR circuit for obtaining a third control signal (Uxor); and
   calculating an average between the third control signal (Uxor) and the second control signal (Ucout).

3. A method according to claim 2, wherein the producing of the component control signal (Uave) comprises:
   mathematically averaging said third control signal (Uxor) and second control signal (Ucount).

4. A method according to claim 1, further comprising:
   producing a gate voltage (Urg) by changing the voltage level of the component control signal (Uave).

5. A method according to claim 4, wherein producing the gate voltage (Urg) comprises:
   amplifying the component control signal (Uave).

6. A method according to claim 1, further comprising:
   feeding the fault signal to an upper control level.

7. A method according to claim 1, further comprising:
   locking the fault signal (Ufault) in order to disable control of the component.

8. A method according to claim 3, further comprising:
   producing a gate voltage (Urg) by changing the voltage level of the component control signal (Uave).

9. A method according to claim 8, wherein producing the gate voltage (Urg) comprises:
   amplifying the component control signal (Uave).

10. A method according to claim 4, further comprising:
    feeding the fault signal to an upper control level.

11. A method according to claim 9, further comprising:
    feeding the fault signal to an upper control level.

12. A method according to claim 4, further comprising:
    locking the fault signal (Ufault) in order to disable control of the component.

13. A method according to claim 10, further comprising:
    locking the fault signal (Ufault) in order to disable control of the component.

14. A method according to claim 11, further comprising:
    locking the fault signal (Ufault) in order to disable control of the component.

15. A control circuit for controlling a power semiconductor component, comprising:
    means for producing a control signal (Ucin) for controlling the component;
    means for forming a second control signal (Ucout) at the potential of controlled component from the control signal (Ucin), wherein the second control signal has logic high and logic low levels which are equal to first and second supply voltages, respectively;
    means for measuring a current flowing through the component;
    means for comparing the measured current with a set limit;
    means for providing a fault signal (Ufault) having a logical state based on comparing the measured current and the set limit;
    means for producing a component control signal (Uave) from the fault signal (Ufault) and the second control signal (Ucout) such that whenever a fault is indicated, the component control signal has an amplitude between the high and low power supply voltages, and otherwise the amplitude of the component control signal (Uave) is equal to the second control signal (Ucout); and
    means for controlling the component with the component control signal (Uave).

* * * * *